(12) United States Patent
Miesterfeld

(10) Patent No.: US 6,653,845 B2
(45) Date of Patent: Nov. 25, 2003

(54) ADDRESSABLE OPEN CONNECTOR TEST CIRCUIT

(75) Inventor: Frederick O Miesterfeld, Troy, MI (US)

(73) Assignee: DaimlerChrysler Corporation, Auburn Hills, MI (US)

( * ) Notice: Subject to any disclaimer, the term of this patent is extended or adjusted under 35 U.S.C. 154(b) by 0 days.

(21) Appl. No.: 10/083,831

(22) Filed: Feb. 25, 2002

(65) Prior Publication Data

US 2003/0160620 A1 Aug. 28, 2003

(51) Int. Cl.$^7$ ............................................... G01R 31/02
(52) U.S. Cl. ..................................... 324/538; 324/528
(58) Field of Search ................................ 324/538, 539, 324/543, 525, 527, 528; 340/568.4, 870.16, 870.18; 379/254, 100.12, 164

(56) References Cited

U.S. PATENT DOCUMENTS

| | | | |
|---|---|---|---|
| 4,209,666 A | 6/1980 | Lawton | 370/222 |
| 4,370,561 A | 1/1983 | Briggs | 307/9.1 |
| 4,463,341 A | 7/1984 | Iwasaki | 340/310.01 |
| 4,677,308 A | 6/1987 | Wroblewski et al. | 340/459 |
| 4,736,367 A | 4/1988 | Wroblewski et al. | 340/3.51 |
| 5,079,759 A | 1/1992 | Kajiyama | 370/245 |
| 5,442,697 A | 8/1995 | McGary et al. | 379/399.02 |
| 5,587,824 A | 12/1996 | Asprey | 250/226 |
| 5,606,671 A | * 2/1997 | Wadsworth et al. | 710/106 |
| 5,701,411 A | * 12/1997 | Tran et al. | 709/250 |
| 6,091,324 A | 7/2000 | Arsenault | 340/449 |
| 6,138,080 A | 10/2000 | Richardson | 702/79 |
| 6,151,298 A | 11/2000 | Bernhardsson | 370/225 |
| 6,154,447 A | 11/2000 | Vedder | 370/244 |
| 6,160,405 A | * 12/2000 | Needle et al. | 324/538 |
| 6,344,748 B1 | * 2/2002 | Gannon | 324/542 |

* cited by examiner

Primary Examiner—N. Le
Assistant Examiner—Vincent Q. Nguyen
(74) Attorney, Agent, or Firm—Edwin W. Bacon, Jr.

(57) ABSTRACT

An open circuit detection apparatus is provided for detecting whether a connection is closed between a local node and a remote node having a known impedance. A ping source is connected to the local node. The ping source has an output for transmitting an address unique to the remote node and an input for sensing the impedance of the remote node. A test circuit is connected to the remote node. The test circuit has an address decoder for receiving the address from the output. The address decoder has a unique address and asserts a control signal upon the address matching the unique address of said address decoder. An impedance-varying device is responsive to the control signal and effects a change in the impedance of the remote node. The change in the impedance of the remote node is sensed by the input of the ping source.

4 Claims, 3 Drawing Sheets

ADDRESSABLE OPEN CONNECTOR TEST CIRCUIT

This invention relates generally to diagnostic systems for networked electronics and more specifically to diagnostic systems for electrical connections in networked electronics.

BACKGROUND

Modern electrical systems employ networks to reduce the number of conductors needed to implement ever-increasing electrical functionality. In a typical networked system, a central application computer executes a software program to implement a particular function. The application computer receives input data from a number of input sources such as switches and sensors. The software program then evaluates the input data and thereupon makes a determination to effect an output. The output is then converted to physical action by an output device such as an electrical motor or lamp. Communication between the input sources, application computer, and output devices takes place over the network.

In the event of a breakdown of a component in the networked system, a technician must generally be employed to find the cause of the breakdown. In making a diagnosis, the technician often relies on diagnostic routines contained in the software program and executed by the application computer. These diagnostic routines often execute under the assumption that the network wiring connection is intact between the application computer and the related input sources and output devices. If the wiring connection is intact, the control computer almost always accurately diagnoses the source of the breakdown and the technician is likely to effect repair in a single attempt. If the wiring connection is broken however, or only intermittently closes the requisite electrical connection, the control computer is likely to arrive at an erroneous conclusion as to the cause of the breakdown. In this case, the technician will be led by the control computer to erroneously replace an input source or output device. After erroneously making the replacement the technician will then discover the system remains in a state of disrepair. The technician is then left to traditional tools and problem solving methods to discover the broken wiring connection.

Therefore, a diagnostic arrangement is needed for determining whether the wiring connections are intact in a network system.

SUMMARY OF THE INVENTION

Accordingly, a diagnostic arrangement is provided in accordance with the present invention for determining whether the wiring connections are intact in a network system.

In accordance with one aspect of the invention, an open-circuit detection apparatus is provided for detecting whether a connection is closed between a local node and a remote node.

In accordance with another aspect of the invention, a method is provided for determining whether a connection is closed between a local node and a remote node.

Further areas of applicability of the present invention will become apparent from the detailed description provided hereinafter. It should be understood however that the detailed description and specific examples, while indicating preferred embodiments of the invention, are intended for purposes of illustration only, since various changes and modifications within the spirit and scope of the invention will become apparent to those skilled in the art from this detailed description.

DETAILED DESCRIPTION OF THE PREFERRED EMBODIMENT

Figure 1:
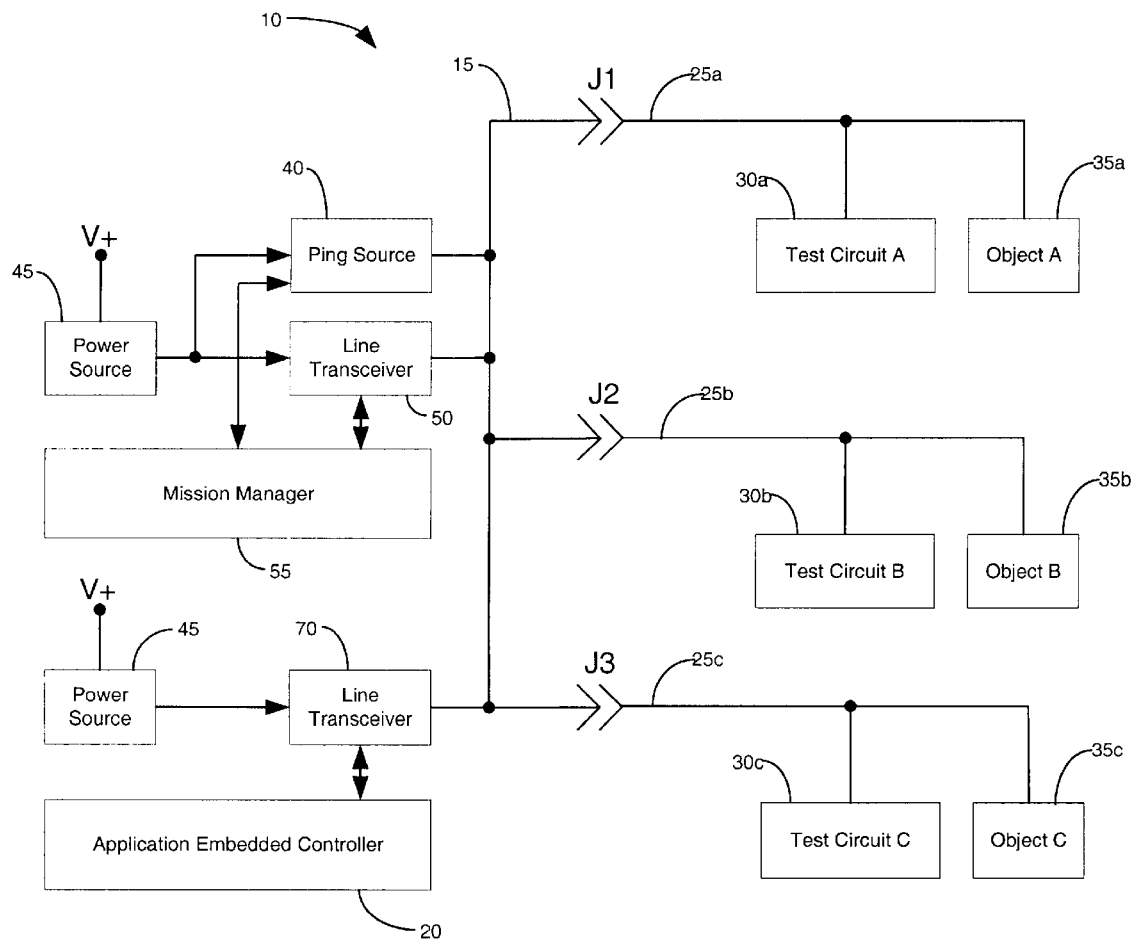
FIG. 1 depicts a network system in accordance with the present invention.

Turning now to FIG. 1 a network 10 is shown. While not to be construed as limiting, the network 10 can be a control arrangement for a motor vehicle. A controller 20 communicates with a controller node 15 via a controller line transceiver 70. A power source 45 is provided to energize the transceiver 70. The controller node 15 is also common to a line transceiver 50, a ping source 40, and connectors J1, J2 and J3. Each of the connectors J1, J2, J3 operate to electrically connect an object node 25a, 25b, and 25c, respectively, to the network node 15. Each object node is also common to a test circuit and an object. Therefore, by way of example, object node 25a is common to J1, Test Circuit 30a, and Object A 35a. Each object 35a, 35b, and 35c may be an input, such as a switch node or a sensor node, or an object 35 may be a load, such as motor node or lamp node. Each object 35a, 35b, and 35c communicates with the controller 20 via its associated object node 25a, 25b, and 25c. Each test circuit 30a, 30b, 30c is connected to an object node 25a, 25b, 25c and operates to substantially change the impedance of its associated object node 25a, 25b, 25c in response to receiving a unique address from the ping source 40. The ping source 40 transmits an address unique to one of the test circuits 30a, 30b, 30c, and subsequently senses the impedance of the object node 25a, 25b, 25c, associated with the addressed test circuit. For example, to diagnose connector J2 the ping source 40 transmits an address unique to test circuit 30b. In response to receipt of its unique address, test circuit 30b substantially changes the impedance of object node 25b. The ping source 40 detects the substantial change in impedance thereby indicating that connector J2 is closed.

A mission manager 55 executes the method of the instant invention, which is discussed later. The mission manager 55 communicates with the controller 20 and objects 35a, 35b, 35c via mission line transceiver 50. The mission manager 55 also communicates with the ping source 40. A power source 45 is provided to energize the ping source 40 and mission line transceiver 50. The mission manager 55 cooperates with the ping source 40 to determine whether connections J1, J2 and J3 are closed.

Figure 2:
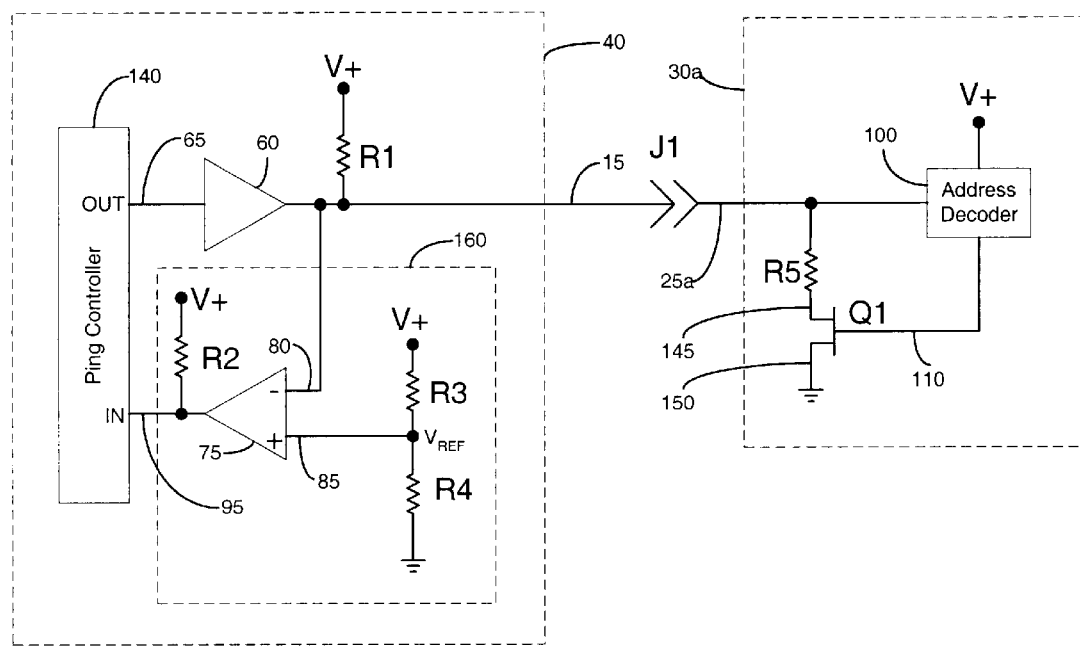
FIG. 2 depicts a detailed schematic of the ping source and a test circuit of FIG. 1.

Turning now to FIG. 2, a detailed view of the ping source 40 and a single test circuit 30a is shown. It should be noted that test circuits 30a, 30b and 30c are identical in function with the exception that each responds only to a unique address, as is described later. Mission manager 55 employs a suitable means, such as detecting a "QUIET MODE" message from the controller 20, of sensing when the network node 15 is expected to be free of communication traffic. At the time the network node 15 is free of communication, the mission manager 55 instructs the ping controller 140 to emit a stream 105 of n bits (shown in FIG. 3(a)) from the output 65. The n bits represent a unique address of object node 25a. A buffer 60 amplifies the n bits for transmission on the network node 15. The bits travel across the network node 15 to an address decoder 100 via the connection J1 and the object node 25a. The address decoder 100 asserts gate control 110 in response to receiving the unique n bit address transmitted by the ping controller 140. The transistor Q1 is normally off and conducts in response to the assertion by the gate control 110. In the drawing of FIG. 1, each object node 25a, 25b, 25c has a unique address. Therefore, only one of the test circuits 30a, 30b, and 30c is activated by the unique address in the bit stream 105.

Detecting a Closed Connection

In the situation where connection J1 is closed, the conduction of transistor Q1 creates a voltage divider between resistors R1 and R5. Approximating the voltage drop across the drain 145 and source 150 as zero, the voltage at controller node 15 is given by the equation $V=V^{+}*R5/(R1+R5)$. The voltage at controller node 15 also appears at the inverting input 80 of comparator 75. The non-inverting input 85 has a reference voltage $V_{REF}$ established by the voltage divider created by resistors R3 and R4. The reference voltage $V_{REF}$ is given by the equation $V_{REF}=V^{+}*R4/(R3+R4)$. The resistors R1 and R3–R5 should be chosen such that $V_{REF}$ is greater than the voltage at the inverting input 80 when transistor Q1 is conducting. With non-inverting input 85 at a higher voltage than the inverting input 80, the comparator output 95 will be go high.

The ping controller 140 then determines that the connection J1 is closed based on detecting a high voltage at the output 95.

Detecting an Open Connection

Continuing to look at FIG. 2 assume that connection J1 is open, such as would be the case when a connection is broken. Again, the ping controller 140 of the ping source 40 will emit a stream of n bits from the output 65. With connection J1 open, test circuit 30 is disconnected and unable to receive the stream of bits 105. At the same time, other test circuits 30 that have good connections to the network node 15 will not react to the bit stream 105. These other test circuits 30 each have an address decoder 100 that will not assert its gate control 110 in response to the address of another node. Therefore none of the transistors Q1 will conduct and all of the connected test circuits 30 will have a high input impedance. With connection J1 open and the other connected test circuits 30 at a high impedance, the voltage at controller node 15 and inverting input 80 is approximately equal to $V^{+}$. Voltage $V_{REF}$ appears at non-inverting input 85. With the inverting input 80 at a higher voltage than the non-inverting input 85, the comparator output 95 will go low.

The ping controller 140 then detects the low voltage at the output 95 to determine that connection J1 is open.

Figure 3A:
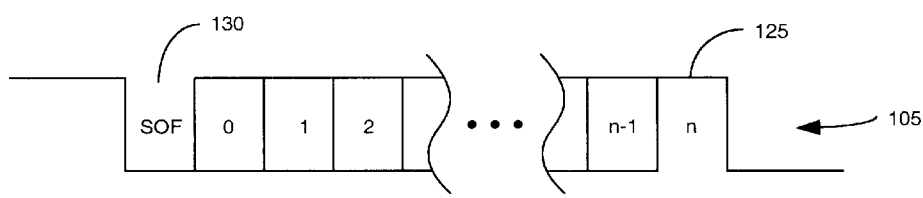
FIGS. 3(a) and 3(b) depict state diagrams of the invention.
Figure 3B:

FIGS. 3(a) and 3(b) show examples of state diagrams of the address decoder 100. FIG. 3(a) shows a stream of the n bits that enter the address decoder 100 via object node 25a. The stream of bits may be preceded by a preamble, such as a start-of-frame 130 (SOF) indication as is known in the art. FIG. 3(b) shows the behavior of gate control 110. Normally gate control 110 is at a low state, thereby turning off transistor Q1. After receiving the stream of n bits 105 that match the unique address of the address decoder 100 however, the address decoder 100 asserts the gate control 110.

Figure 4A:
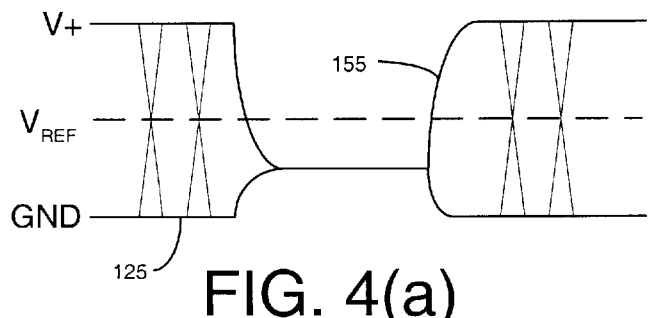
FIGS. 4(a) and 4(b) depict voltage waveforms related to a closed wiring connection in accordance with the invention.
Figure 4B:
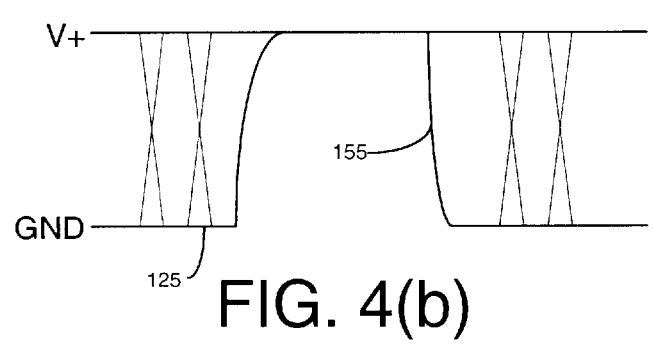

FIGS. 4(a) and 4(b) show, by way of example, voltage waveforms at the comparator 75 when a connection, such as J1, is under test and closed. The reference voltage $V_{REF}$, which appears at the non-inverting input 85, is represented as a dashed line. The vertical axis represents volts and the horizontal axis represents time. FIG. 4(a) shows the voltage appearing at the inverting input 80. While the n-th bit 125 is being transmitted on the controller node 15 the voltage of the inverting input 80 is irrelevant, as shown by the cross hatching in the voltage waveform. After the n-th bit 125 is transmitted, the voltage at the inverting input 80 drops below $V_{REF}$ until the address decoder 100 turns off transistor Q1 via the gate control 110. FIG. 4(b) shows that while transistor Q1 is turned on the voltage at the output 95 of the comparator 75 is high. The output 95 goes to an indeterminate state when the transistor Q1 is turned off at time 155.

Figure 5A:
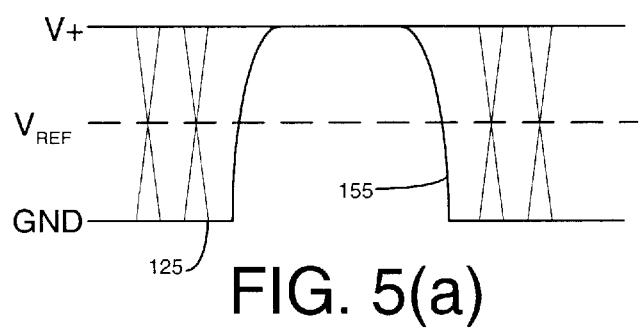
FIGS. 5(a) and 5(b) depict voltage waveforms related to an open wiring connection in accordance with the invention.
Figure 5B:
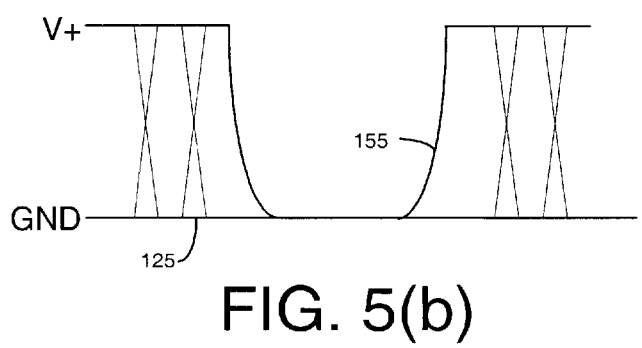

FIGS. 5(a) and 5(b) show examples of voltages at the comparator 75 when a connection is open and under test. Like the waveforms of FIGS. 4(a) and 4(b), the vertical axis of the graphs in FIGS. 5(a) and 5(b) represent voltage and the horizontal axis represent time. FIG. 5(a) shows that when a connection, such as J1, is open and the n-th bit 125 has been sent by the buffer 60, the inverting input 80 is pulled up to $V^{+}$ by the resistor R1. The non-inverting input 85 remains at $V_{REF}$ as established by R3 and R4. With the voltage at the inverting input 80 at a higher voltage than $V_{REF}$, the output 95 of the comparator will go low as shown in FIG. 5(b). FIG. 5(b) also shows that output 95 returns to an indeterminate state at time 155 after the ping controller has sent the n-th bit and received the low signal from the output 95.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An open circuit detection apparatus for detecting whether a connection is closed between a local node and a remote node having a known impedance, the apparatus comprising:

a ping source connected to the local node, said ping source further comprising
an output for transmitting an address unique to the remote node; and
an input for sensing the impedance of one of a plurality of remote nodes;

a plurality of test circuits, each test circuit being connected to one of said plurality of remote nodes and each test circuit further comprising
an address decoder for receiving said address from said output, said address decoder having a unique address;
a control signal, said address decoder asserting said control signal upon said address matching said unique address of said address decoder; and
an impedance varying device being responsive to said control signal, said impedance varying device effecting a change in the impedance of its remote node; and
said change in the impedance of the remote node being sensed by said input of said ping source.

2. The apparatus of claim 1 wherein the address decoder is adapted to receive an n number of bits.

3. An open circuit detection apparatus for detecting whether a connection is closed between a local node and a remote node having a known impedance, the apparatus comprising:

a ping source connected to the local node, said ping source further comprising
an output for transmitting an address comprising an n number of bits unique to the remote node; and
an input for sensing the impedance of the remote node;

a test circuit connected to the remote node, said test circuit further comprising
an address decoder for receiving said address comprising an n number of bits from said output, said address decoder having a unique address;
a control signal, said address decoder asserting said control signal upon said address matching said unique address of said address decoder; and
a transistor being responsive to said control signal, said transistor effecting a change in the impedance of the remote node; and
said change in the impedance of the remote node being sensed by said input of said ping source.

4. In an open circuit detection apparatus for detecting whether a connection is closed between a local node and a remote node, the remote node having a known impedance, the apparatus having a ping source connected to the local node, the ping source having an output for transmitting an n-bit address unique to the remote node and an input for sensing the impedance of the remote node, a test circuit for effecting a change in the known impedance of the remote node, the test circuit comprising:

an address decoder for receiving the n-bit address from the output, said address controller having a unique address;
a control signal, said address decoder asserting said control signal upon the address matching said unique address of said address decoder; and
a transistor being responsive to said control signal, said transistor effecting a change in the impedance of the remote node, said change indicating to the input that the connection is closed.

* * * * *